(12) United States Patent
Viswanath et al.

(10) Patent No.: US 8,782,589 B1
(45) Date of Patent: Jul. 15, 2014

(54) SOFT PIN INSERTION DURING PHYSICAL DESIGN

(71) Applicant: International Business Machines Corporation, Armonk, NY (US)

(72) Inventors: Manikandan Viswanath, South Burlington, VT (US); Samuel I. Ward, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/733,016

(22) Filed: Jan. 2, 2013

(51) Int. Cl.
*G06F 17/50* (2006.01)

(52) U.S. Cl.
USPC .................................................. 716/132

(58) Field of Classification Search
USPC ................................................ 716/100, 132
See application file for complete search history.

(56) References Cited

U.S. PATENT DOCUMENTS

| | | | | |
|---|---|---|---|---|
| 5,980,093 A * | 11/1999 | Jones et al. | .................... | 716/129 |
| 6,298,468 B1 * | 10/2001 | Zhen | ............................ | 716/122 |
| 6,557,145 B2 | 4/2003 | Boyle et al. | | |
| 6,678,871 B2 | 1/2004 | Takeyama et al. | | |
| 6,708,144 B1 * | 3/2004 | Merryman et al. | ............. | 703/14 |
| 6,792,585 B1 | 9/2004 | Ku et al. | | |
| 7,266,796 B1 | 9/2007 | Chu et al. | | |
| 7,464,362 B1 * | 12/2008 | Borer et al. | .................... | 716/138 |
| 7,669,157 B1 * | 2/2010 | Borer et al. | .................... | 716/103 |
| 8,234,615 B2 * | 7/2012 | Ramji et al. | .................. | 716/129 |
| 8,250,505 B1 * | 8/2012 | Borer et al. | .................... | 716/104 |
| 8,423,946 B1 * | 4/2013 | Jin et al. | ........................ | 716/133 |
| 8,635,572 B1 * | 1/2014 | Jin et al. | ........................ | 716/120 |
| 2005/0076319 A1 * | 4/2005 | Chow et al. | ..................... | 716/10 |
| 2012/0036491 A1 * | 2/2012 | Ramji et al. | .................. | 716/122 |

OTHER PUBLICATIONS

Pedram, Massoud, et al., "Floorplanning with Pin Assignment," IEEE Int'l Conf. on Computer-Aided Design Digest, pp. 98-101 (1990).

* cited by examiner

*Primary Examiner* — Suchin Parihar
(74) *Attorney, Agent, or Firm* — Matthew W. Baca; Jack V. Musgrove

(57) ABSTRACT

A netlist for an integrated circuit design is constrained by virtual or "soft" pins to control or stabilize the placement of logic such as an architectural logic path. One soft pin is inserted at a fixed location proximate an input net of the path and is interconnected with the input net, and another is inserted at a fixed location proximate the output net and is interconnected with the output net. Cell placement is then optimized while maintaining the virtual pins at their fixed locations. More than two virtual pins may be inserted to bound a cluster of logic. The virtual pins may lie along the input/output nets. Pseudo-net weights are assigned to pseudo-nets formed between a cell and the virtual pins, and the pseudo-net weight can be increased for each placement iteration.

25 Claims, 5 Drawing Sheets

SOFT PIN INSERTION DURING PHYSICAL DESIGN

BACKGROUND OF THE INVENTION

1. Field of the Invention

The present invention generally relates to the design of semiconductor chips and integrated circuits, and more particularly to a method of placing components of an integrated circuit design in a layout.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The result is a set of design files known as an intermediate form that describes the layout. The design files are then run through a dataprep process that is used to produce patterns called masks by an optical or electron beam pattern generator. During fabrication, these masks are used to etch or deposit features in a silicon wafer in a sequence of photolithographic steps using a complex lens system that shrinks the mask image. The process of converting the specifications of an electrical circuit into such a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. However, physical synthesis can take days to complete, and the computational requirements are increasing as designs are ever larger and more gates need to be placed. There are also more chances for bad placements due to limited area resources. Given a netlist $N=(V, E)$ with nodes (vertices) V and nets (edges) E, a global placement tool obtains locations $(x_i, y_i)$ for all the movable nodes, such that the area of nodes within any rectangular region does not exceed the area of cell sites in that region. Though some work has looked at general Steiner wirelength optimization, placers typically minimize the half-perimeter wirelength (HPWL) of the design. Modern placers often approximate HPWL by a differentiable function using a quadratic objective.

Today's synthesis environment balances the slack (and distance) between logic gates, primary inputs (PI) and primary outputs (PO). Balancing the slack leads to a better placement of logic clusters timing-wise but it may break critical logic paths, sometimes referred to architectural logic paths. Accordingly, a designer often needs to fix or stabilize the placement of portions of the design. Current approaches to stabilizing placement solutions include preplacing gates, using movebounds, or using structured soft blocks. Preplacement of gates requires physically coding (e.g., VHDL and physical synthesis parameters) the gates and the locations. Movebounds limit the placement of logic hierarchies to specific regions. Structured soft blocks can define relative order of logic structures and relative locations.

SUMMARY OF THE INVENTION

The present invention is generally directed to a method of stabilizing or controlling placement of logic such as an architectural logic path in an integrated circuit design by receiving a circuit description of the design which include an input net of the logic path and an output net of the logic path, designating the logic path as a region for which placement stability is desired, inserting in the circuit description at least first and second virtual (soft) pins wherein the first virtual pin has a first fixed location proximate the input net and is interconnected with the input net and the second virtual pin has a second fixed location proximate the output net and is interconnected with the output net, and then optimizing placement of the cells while maintaining the virtual pins at their fixed locations. More than two virtual pins may be inserted to bound a cluster of logic. The virtual pins may lie along a path of the input/output nets. In the implementation wherein the optimization minimizes a wirelength function, the method may further assign a pseudo-net weight to pseudo-nets formed between a cell and the virtual pins, wherein the pseudo-net weight is greater than a standard weighting for the wirelength function. The pseudo-net weight can be increased for each placement iteration.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Current microprocessor trends are integrating traditionally custom designs with random logic macros (RLMs) into very large integrated circuit designs. In some cases, entire microprocessor units are designed using an automated synthesis flow that integrates these traditional custom designs and RLMs. This type of merged synthesis run is referred to as large block synthesis (LBS). The LBS blocks, i.e., sets of cells or logic modules, require handling dataflow designs differently than traditional RLMs. In particular, as the size of the designs grow, it takes significant effort to make synthesis generate architecturally correct placement solutions due to placement instability as problems with timing and congestion are incrementally solved. Slight changes to the assertions in the circuit design can drastically modify the placement solution, creating new timing problems that where not there before. Balanced timing is often not achieved until the product development phase becomes stable.

Current techniques for controlling or stabilizing placement solutions (preplacing gates, movebounds, structured soft blocks) have significant drawbacks. The manual coding of the gates and locations required in preplacement is extremely tedious. This approach not only limits changes in physical placement (since it forces an object to a specific location), but additionally does not allow flexibility to optimize the logic past that point. For example, a NAND2 gate might be in the netlist and then preplaced; the physical synthesis tool might want to modify that gate into a more efficient NOR2-inverter combination but will be prevented from doing so. With movebound stabilizing, all logic within the bounds is affected so if only one logic path requires fixing this approach unnecessarily constrains the design. Movebound coding can also be very time consuming. Structured soft blocks similarly require extensive coding and significantly limit flexibility.

Figure 1A:
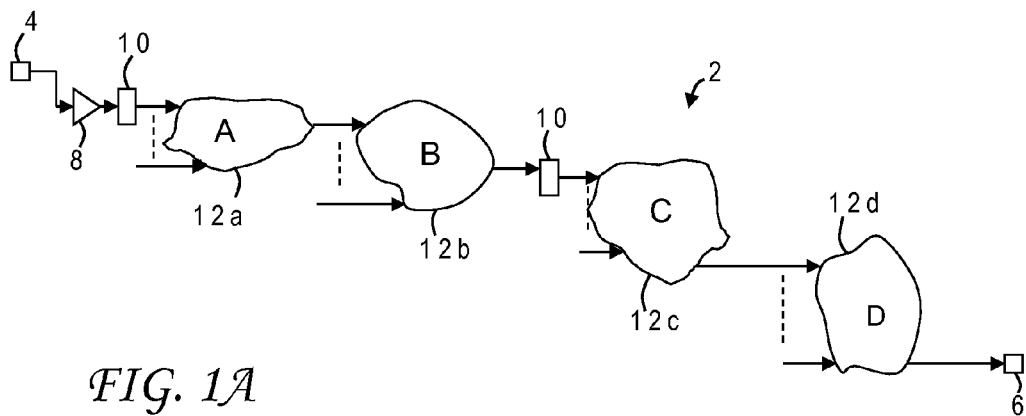
FIG. 1A is a plan view of a sample design for an integrated circuit having various logic regions which whose placement is to be optimized.
Figure 1B:
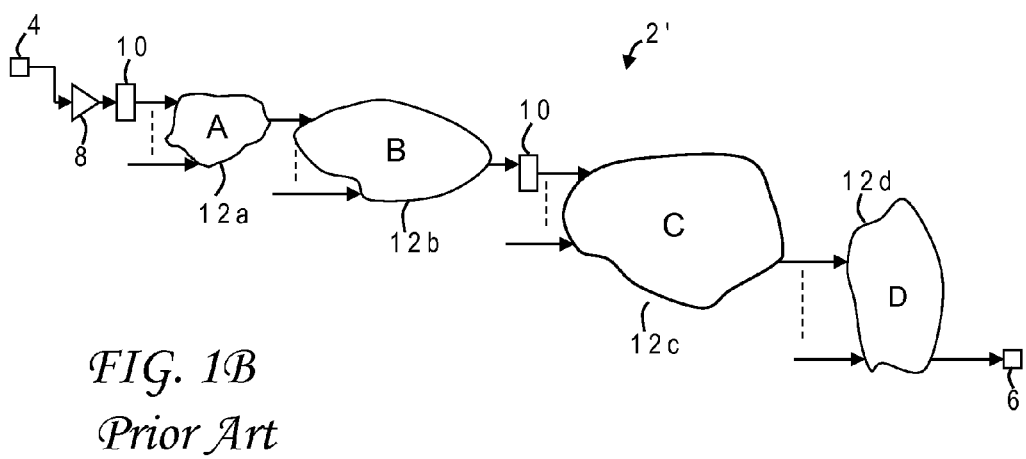
FIG. 1B is a plan view of the sample design of FIG. 1A illustrating how conventional optimization techniques can result is distortion or spreading of cells along an architectural logic path.

Accordingly, in current flows, there is no way to force specific points of a logic path to selectively stay close together or otherwise maintain stability. FIGS. 1A and 1B illustrate a typical example of this problem. FIG. 1A shows a sample circuit design 2 having one or more primary inputs (PI) 4, one or more primary outputs (PO) 6, one or more buffers 8, and one or more latches 10, with a plurality of logic clusters 12a, 12b, 12c, 12d labeled A-D. In this particular example, for whatever reasons, the designer would like to control the architectural path through regions B and C. However, as seen in FIG. 1B, the placement optimization algorithm results in a modified layout 2' wherein regions B and C have become unacceptably distorted or spread out.

It would, therefore, be desirable to devise an improved method of automated logic placement which could overcome the limitations of the prior art and allow stabilization of a specific logic path without undue interference with other logic in the design. It would be further advantageous if the method could give designers the ability to force placement regions during synthesis but still allow the physical synthesis tool to robustly optimize the logic. The present invention achieves these objectives by inserting a "soft" pin in the circuit description proximate a region of interest, e.g., a selected region that lies along an architectural logic path. The soft pin is not real, that is, it is not part of the original netlist and is not part of the functional circuit. The soft pin can be removed from the netlist after the placement process is complete. Designs can now be stabilized gradually, reducing the impact from updated assertions or unrelated logic changes. The invention thereby imparts significantly more flexibility to the designer to control specific logic paths during synthesis iterations.

Figure 2:
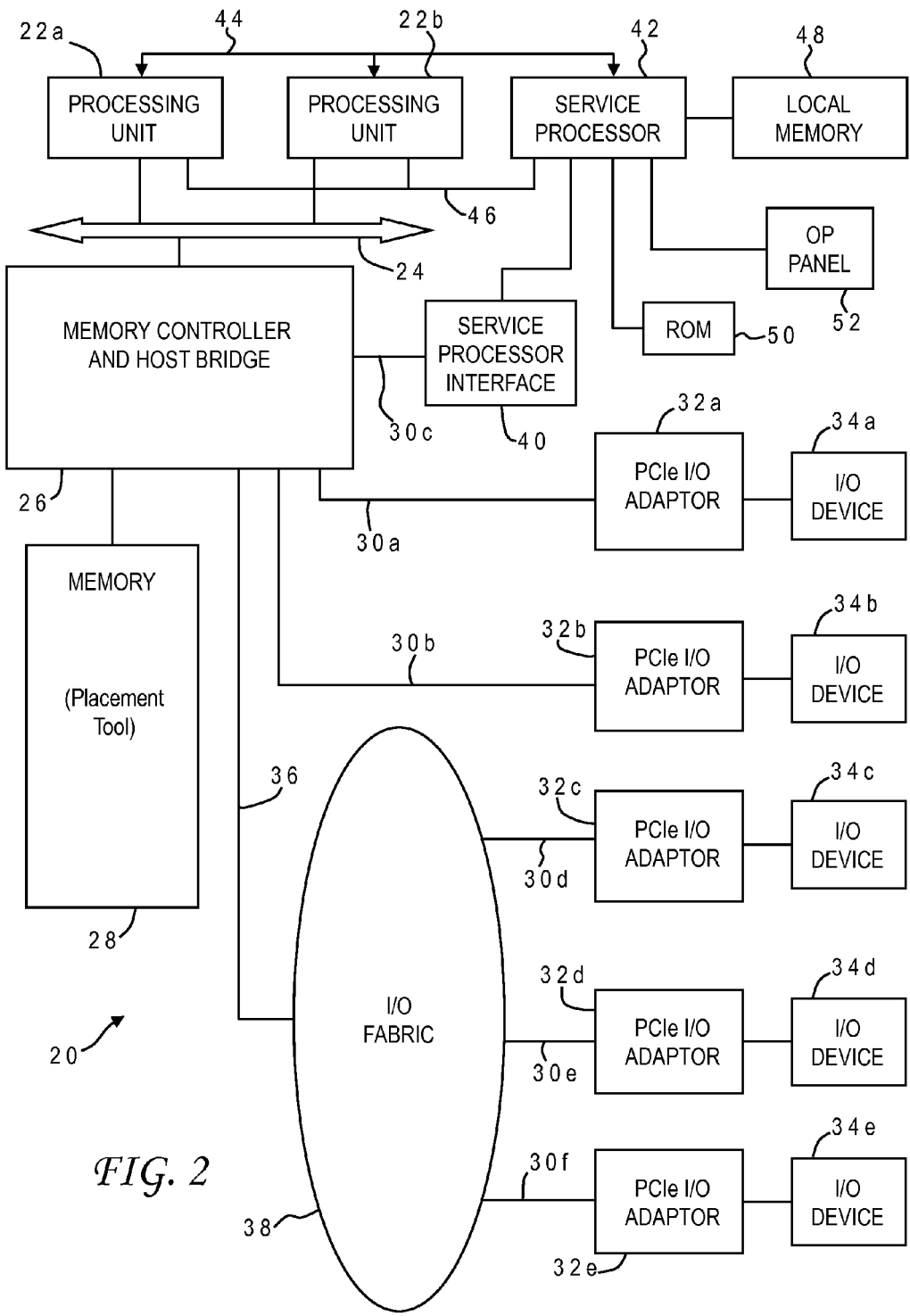
FIG. 2 is a block diagram of a computer system programmed to carry out integrated circuit design in accordance with one implementation of the present invention.

With reference now to the figures, and in particular with reference to FIG. 2, there is depicted one embodiment 20 of a computer system in which the present invention may be implemented to carry out the design of logic structures in an integrated circuit. Computer system 20 is a symmetric multiprocessor (SMP) system having a plurality of processors 22a, 22b connected to a system bus 24. System bus 24 is further connected to a combined memory controller/host bridge (MC/HB) 26 which provides an interface to system memory 28. System memory 28 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 26 also has an interface to peripheral component interconnect (PCI) Express links 30a, 30b, 30c. Each PCI Express (PCIe) link 30a, 30b is connected to a respective PCIe adaptor 32a, 32b, and each PCIe adaptor 32a, 32b is connected to a respective input/output (I/O) device 34a, 34b. MC/HB 26 may additionally have an interface to an I/O bus 36 which is connected to a switch (I/O fabric) 38. Switch 38 provides a fan-out for the I/O bus to a plurality of PCI links 30d, 30e, 30f. These PCI links are connected to more PCIe adaptors 32c, 32d, 32e which in turn support more I/O devices 34c, 34d, 34e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 26 provides a low latency path through which processors 22a, 22b may access PCI devices mapped anywhere within bus memory or I/O address spaces. MC/HB 26 further provides a high bandwidth path to allow the PCI devices to access memory 28. Switch 38 may provide peer-to-peer communications between different endpoints and this data traffic does not need to be forwarded to MC/HB 26 if it does not involve cache-coherent memory transfers. Switch 38 is shown as a separate logical component but it could be integrated into MC/HB 26.

In this embodiment, PCI link 20c connects MC/HB 26 to a service processor interface 40 to allow communications between I/O device 34a and a service processor 42. Service processor 42 is connected to processors 22a, 22b via a JTAG interface 44, and uses an attention line 46 which interrupts the operation of processors 22a, 22b. Service processor 42 may have its own local memory 48, and is connected to read-only memory (ROM) 50 which stores various program instructions for system startup. Service processor 42 may also have access to a hardware operator panel 52 to provide system status and diagnostic information.

In alternative embodiments computer system 20 may include modifications of these hardware components or their interconnections, or additional components, so the depicted example should not be construed as implying any architectural limitations with respect to the present invention. The invention may further be implemented in an equivalent cloud computing network.

When computer system 20 is initially powered up, service processor 42 uses JTAG interface 44 to interrogate the system (host) processors 22a, 22b and MC/HB 26. After completing the interrogation, service processor 42 acquires an inventory and topology for computer system 20. Service processor 42 then executes various tests such as built-in-self-tests (BISTs), basic assurance tests (BATs), and memory tests on the components of computer system 20. Any error information for failures detected during the testing is reported by service processor 42 to operator panel 52. If a valid configuration of system resources is still possible after taking out any components found to be faulty during the testing then computer system 20 is allowed to proceed. Executable code is loaded into memory 28 and service processor 42 releases host processors 22a, 22b for execution of the program code, e.g., an operating system (OS) which is used to launch applications and in particular the circuit design application of the present invention, results of which may be stored in a hard disk drive of the system (an I/O device 34). While host processors 22a, 22b are executing program code, service processor 42 may enter a mode of monitoring and reporting any operating parameters or errors, such as the cooling fan speed and operation, thermal sensors, power supply regulators, and recoverable and non-recoverable errors reported by any of processors 22a, 22b, memory 28, and MC/HB 26. Service processor 42 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such storage media excludes transitory media such as propagating signals.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 20 carries out program instructions for an integrated circuit design process that uses novel placement techniques to stabilize selected logic paths of the design. Accordingly, a program embodying the invention may include conventional aspects of various placement tools, and these details will become apparent to those skilled in the art upon reference to this disclosure.

Figure 3A:
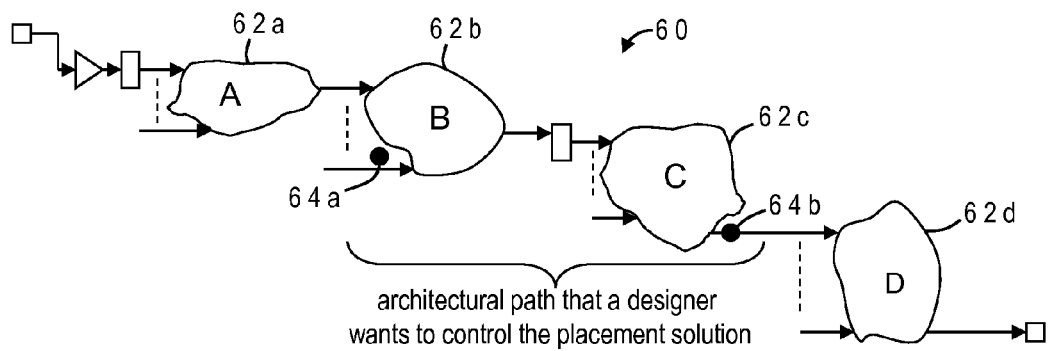
FIG. 3A is a plan view of a sample circuit similar to that of FIG. 1A with the addition of soft pins to stabilize a selected architectural path having two logic clusters in accordance with one implementation of the present invention.

Referring now to FIG. 3A, there is depicted a sample circuit layout 60 similar to that of FIG. 1A having four logic clusters or regions 62a, 62b, 62c, 62d (labeled A-D) but the design has now been altered in accordance with the present invention to add soft (virtual) pins 64a, 64b to bound the selected architectural logic path which includes regions 62b and 62c. Circuit layout 60 may be an initial layout for the integrated circuit design, or may be a layout resulting from one or more iterations of cell placement and circuit wiring, or other physical design steps. The architectural logic path has been designated by the designer for placement control/stabilization. Soft pin 64a is located at a first fixed location proximate the input net of region 62b, and soft pin 64b is located at a second fixed location proximate the output net of region 62c. The soft pins do not have to be inserted along the input or output paths, but this may be the case as with soft pin 64b which lies on the net between regions 62c and 62d. Inserting a soft pin closer to an input/output net will result in a tighter placement of the logic, and inserting a soft pin further from a net will result in the logic being more spread out.

Soft pin 64a is interconnected with the input net of the selected logic path while soft pin 64b is interconnected with the output net of the logic path. In the preferred implementation, the invention adds not only soft pins but also pseudo-nets to the circuit description during each global placement iteration. Each pseudo-net c(f, i) is a weighted two-pin connection between a fixed point f (the soft pin) and a cell i in the circuit netlist which was previously connected to the input net or output net of the architectural logic path. The pseudo-nets are assigned weights $w_{i,j}$ which can be increased (e.g., linearly) with consecutive global placement iterations. While many different conventional optimization techniques may be used, the illustrative implementation involves minimizing a wirelength function using a quadratic objective. The pseudo-net weights can be applied as a multiplicative factor to the wirelength of the respective pseudo-nets and are accordingly greater than the standard weighting for nets in the netlist (e.g., 1). The specific net weight numbers depend upon what weighting the placement tool can support, along with designer preferences. The placement of the cells is thus optimized while maintaining the first virtual pin at its fixed location and maintaining the second virtual pin at its fixed location.

Figure 3B:
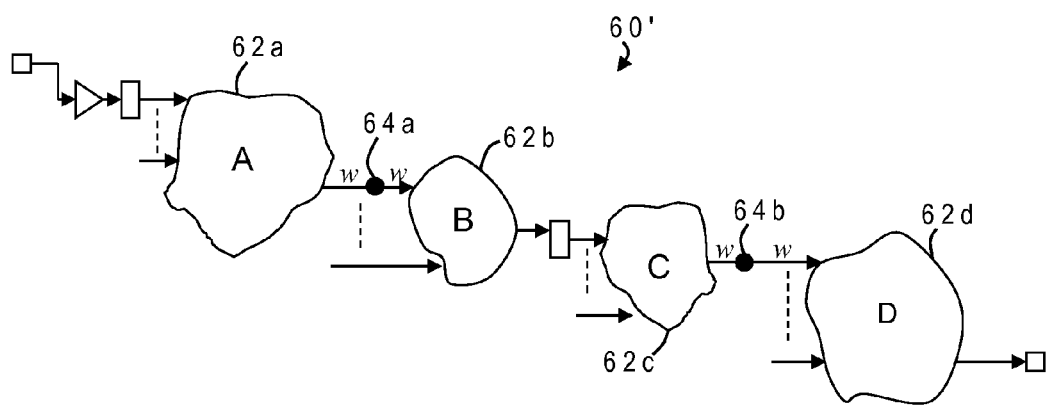
FIG. 3B is a plan view of the circuit of FIG. 3A illustrating how the two targeted logic clusters in the selected architectural path have been stabilized by bounding them within the two inserted soft pins in accordance with one implementation of the present invention.

FIG. 3B shows how the two targeted logic clusters 62b, 62c in the selected architectural path have been stabilized by bounding them within the two inserted soft pins 64a, 64b after multiple placement iterations in a modified layout 60'. Instead of the spreading of these logic clusters as was seen in the prior art optimization of FIG. 1B, the designated logic path is now tightly confined within the bounds of the soft pins, and the other logic clusters 62a, 62d have been spread out. The invention accordingly allows for seamless integration into the current placement paradigm while offering the ability for designers to incrementally control and stabilize the design solutions.

Figure 4:
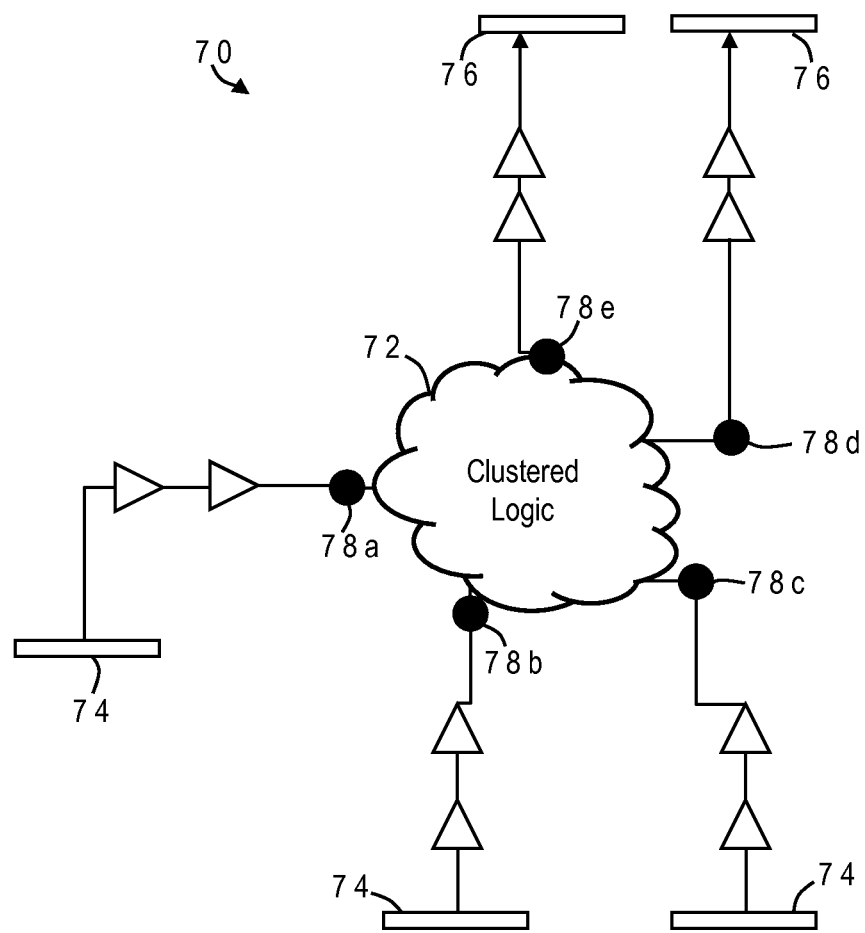
FIG. 4 is a plan view illustrating another example for a circuit layout in which multiple soft pins have been inserted along input paths to a selected logic cluster and multiple soft pins have also been inserted along output paths of the selected logic cluster to bound the logic cluster in accordance with one implementation of the present invention.

While the invention contemplates the use of at least two soft pins to provide bounds for the selected architectural logic path, more than two pins can be used to impart additional control over the placement solution. FIG. 4 depicts such an example wherein a layout 70 includes a logic cluster 72 which receives data from three primary inputs 74 and transmits data to two primary outputs 76. In this example five soft pins 78a, 78b, 78c, 78d, 78e have been inserted, one for each of the primary inputs/outputs, confining the logic to a specific physical region during synthesis. The five soft pins pull the internal edge of cluster 72 together which fixes any timing path issues. Although this effect increases the delays to and from cluster 72, it allows a better buffering solution to be attained from the logic to its primary pins.

Figure 5:
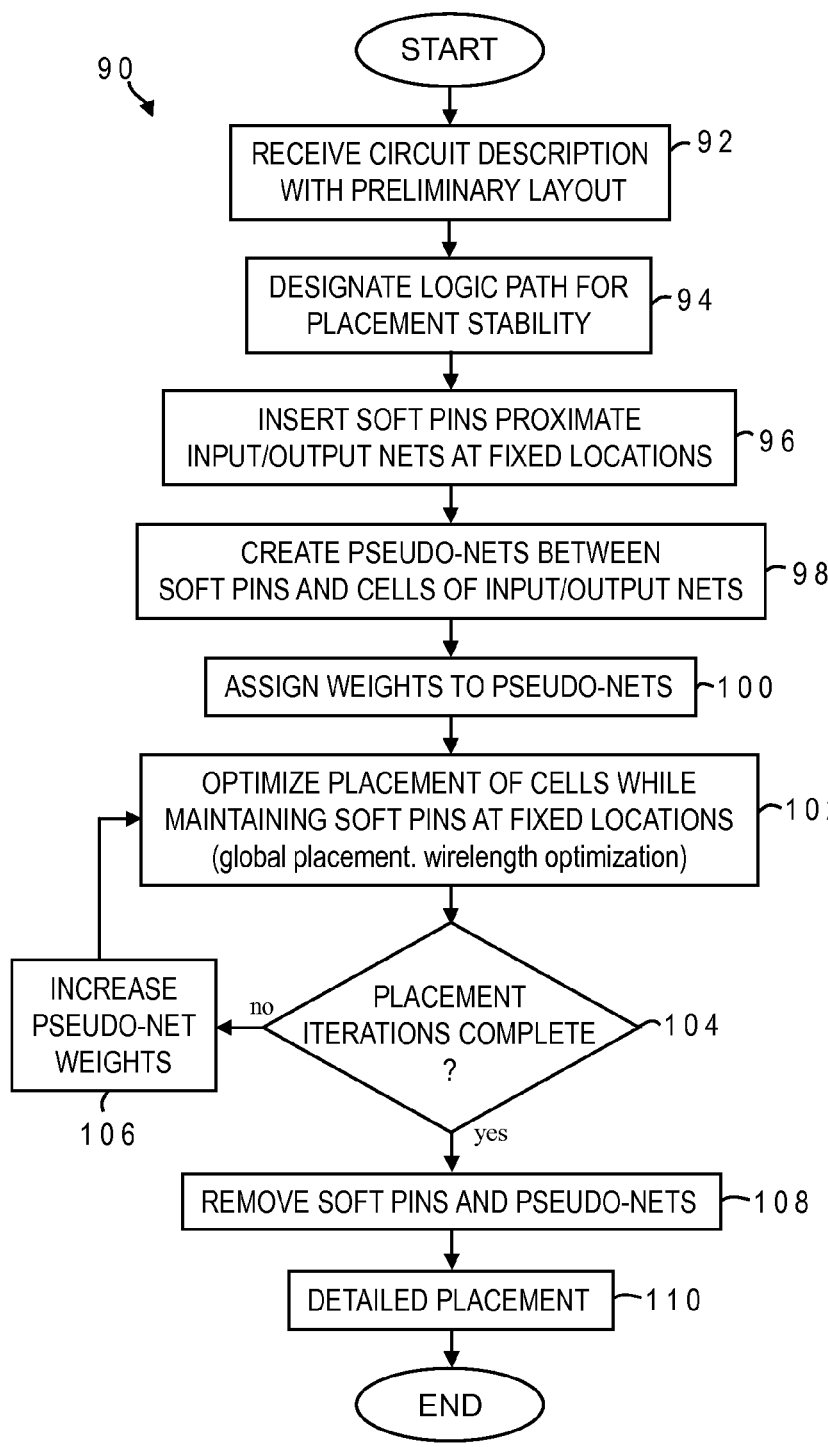
FIG. 5 is a chart illustrating the logical flow for a placement process in accordance with one implementation of the present invention.

The invention may be further understood with reference to the chart of FIG. 5 which illustrates the logical flow for a placement process 90 in accordance with one implementation of the present invention. The process begins when computer system 20 receives a netlist or other circuit description which includes a preliminary layout of the cells (92). At least one logic path is designated for placement stability (94). This designation may be performed manually or may be automated using rule-based selection of logic clusters having predetermined components, functions or characteristics. Soft pins are then inserted proximate input and output nets of the selected logic path at fixed locations (96), and pseudo-nets are created between the soft pins and cells of the input/output nets (98). The initial weights are assigned to the psued-nets (100), and optimized placement begins while maintaining the soft pins at their fixed locations (102). As placement iterations proceed (104), the pseudo-net weights are gradually increased (106). Once the placement iterations are complete, the soft pins and pseudo-nets are removed from the netlist (108). The optimized netlist can then be saved for further processing or can proceed to detailed placement (110).

The soft pins of the present invention thereby allow the designer to direct the physical placement of a logic path from one point to another, or to place the logic more compactly within a region bounded by several pins. A better buffering solution for real pins of the logic path is achieved by confining the logic. This approach does not require modifying the VHDL code to have separate files (as is needed for movebounds), and further does not require modifying the code for specific gates (as needed for preplacement).

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of stabilizing placement of a logic path in an integrated circuit design comprising:
   receiving a circuit description of the integrated circuit design having a plurality of cells interconnected to form a plurality of original nets wherein the original nets include an input net of the logic path and an output net of the logic path in a preliminary layout, by executing first instructions in a computer system;
   designating the logic path as a region for which placement stability is desired, by executing second instructions in the computer system;
   inserting in the circuit description at least first and second virtual pins wherein the first virtual pin has a first fixed location proximate the input net and is interconnected with the input net and the second virtual pin has a second fixed location proximate the output net and is interconnected with the output net, by executing third instructions in the computer system;
   optimizing placement of the cells while maintaining the first virtual pin at the first fixed location and maintaining the second virtual pin at the second fixed location to constrain the logic path, by executing fourth instructions in the computer system; and
   after said optimizing, removing all of the virtual pins from the circuit description, by executing fifth instructions in the computer system.

2. The method of claim 1 wherein the input net is a first input net and the output net is a first output net, and said inserting further inserts in the circuit description third and fourth virtual pins wherein the third virtual pin has a third fixed location proximate a second input net and is interconnected with the second input net and the fourth virtual pin has a fourth fixed location proximate a second output net and is interconnected with the second output net.

3. The method of claim 1 wherein the first fixed location lies along a path of the input net.

4. The method of claim 1 wherein the second fixed location lies along a path of the output net.

5. The method of claim 1 wherein said optimizing of the placement of the cells minimizes a wirelength function constrained by the fixed locations of the virtual pins.

6. The method of claim 5 further comprising assigning a pseudo-net weight to pseudo-nets formed between a cell and the virtual pins, wherein the pseudo-net weight is greater than a standard weighting for the wirelength function.

7. The method of claim 6 wherein said optimizing includes multiple placement iterations, and further comprising increasing the pseudo-net weight for each placement iteration.

8. A computer system comprising:
   one or more processors which process program instructions;
   a memory device connected to said one or more processors; and
   program instructions residing in said memory device for stabilizing placement of a logic path in an integrated circuit design by receiving a circuit description of the integrated circuit design having a plurality of cells interconnected to form a plurality of original nets wherein the original nets include an input net of the logic path and an output net of the logic path in a preliminary layout, designating the logic path as a region for which placement stability is desired, inserting in the circuit description at least first and second virtual pins wherein the first virtual pin has a first fixed location proximate the input net and is interconnected with the input net and the second virtual pin has a second fixed location proximate the output net and is interconnected with the output net, optimizing placement of the cells while maintaining the first virtual pin at the first fixed location and maintaining the second virtual pin at the second fixed location to constrain the logic path and, after the optimizing, removing all of the virtual pins from the circuit description.

9. The computer system of claim 8 wherein the input net is a first input net and the output net is a first output net, and said inserting further inserts in the circuit description third and fourth virtual pins wherein the third virtual pin has a third fixed location proximate a second input net and is interconnected with the second input net and the fourth virtual pin has a fourth fixed location proximate a second output net and is interconnected with the second output net.

10. The computer system of claim 8 wherein the first fixed location lies along a path of the input net.

11. The computer system of claim 8 wherein the second fixed location lies along a path of the output net.

12. The computer system of claim 8 wherein the optimizing of the placement of the cells minimizes a wirelength function constrained by the fixed locations of the virtual pins.

13. The computer system of claim 12 wherein said program instructions further assign a pseudo-net weight to pseudo-nets formed between a cell and the virtual pins, wherein the pseudo-net weight is greater than a standard weighting for the wirelength function.

14. The computer system of claim 13 wherein the optimizing includes multiple placement iterations, and said program instructions further increase the pseudo-net weight for each placement iteration.

15. A computer program product comprising:
   a computer-readable storage medium; and
   program instructions residing in said storage medium for stabilizing placement of a logic path in an integrated circuit design by receiving a circuit description of the integrated circuit design having a plurality of cells interconnected to form a plurality of original nets wherein the original nets include an input net of the logic path and an output net of the logic path in a preliminary layout, designating the logic path as a region for which placement stability is desired, inserting in the circuit description at least first and second virtual pins wherein the first virtual pin has a first fixed location proximate the input net and is interconnected with the input net and the second virtual pin has a second fixed location proximate the output net and is interconnected with the output net, optimizing placement of the cells while maintaining the first virtual pin at the first fixed location and maintaining the second virtual pin at the second fixed location to constrain the logic path and, after the optimizing, removing all of the virtual pins from the circuit description.

16. The computer program product of claim 15 wherein the input net is a first input net and the output net is a first output net, and said inserting further inserts in the circuit description third and fourth virtual pins wherein the third virtual pin has a third fixed location proximate a second input net and is interconnected with the second input net and the fourth virtual pin has a fourth fixed location proximate a second output net and is interconnected with the second output net.

17. The computer program product of claim 15 wherein the first fixed location lies along a path of the input net.

18. The computer program product of claim 15 wherein the second fixed location lies along a path of the output net.

19. The computer program product of claim 15 wherein the optimizing of the placement of the cells minimizes a wirelength function constrained by the fixed locations of the virtual pins.

20. The computer program product of claim 19 wherein said program instructions further assign a pseudo-net weight to pseudo-nets formed between a cell and the virtual pins, wherein the pseudo-net weight is greater than a standard weighting for the wirelength function.

21. The computer program product of claim 20 wherein the optimizing includes multiple placement iterations, and said program instructions further increase the pseudo-net weight for each placement iteration.

22. A method of controlling placement of logic in an integrated circuit design comprising:
receiving a circuit description of the integrated circuit design having a plurality of cells interconnected to form a plurality of original nets wherein the original nets include first and second input nets of the logic path and first and second output nets of the logic path in a preliminary layout, by executing first instructions in a computer system;
designating the logic path as a region for which placement control is desired, by executing second instructions in the computer system;
inserting in the circuit description at least first, second, third and fourth virtual pins wherein the first virtual pin has a first fixed location proximate the first input net and is interconnected with the first input net, the second virtual pin has a second fixed location proximate the second input net and is interconnected with the second input net, the third virtual pin has a third fixed location proximate the first output net and is interconnected with the first output net, and the fourth virtual pin has a fourth fixed location proximate the second output net and is interconnected with the second output net, by executing third instructions in the computer system;
optimizing placement of the cells while maintaining the first virtual pin at the first fixed location, maintaining the second virtual pin at the second fixed location, maintaining the third virtual pin at the third fixed location, and maintaining the fourth virtual pin at the fourth fixed location to constrain the logic path, by executing fourth instructions in the computer system; and
after said optimizing, removing all of the virtual pins from the circuit description, by executing fifth instructions in the computer system.

23. The method of claim 22 wherein the first fixed location lies along a path of the first input net and the third fixed location lies along a path of the first output net.

24. The method of claim 22 wherein said optimizing of the placement of the cells minimizes a wirelength function constrained by the fixed locations of the virtual pins, and further comprising assigning a pseudo-net weight to pseudo-nets formed between a cell and the virtual pins, wherein the pseudo-net weight is greater than a standard weighting for the wirelength function.

25. The method of claim 24 wherein said optimizing includes multiple placement iterations, and further comprising increasing the pseudo-net weight for each placement iteration.

* * * * *